(12) United States Patent
Hirosaki

(10) Patent No.: US 8,147,715 B2
(45) Date of Patent: Apr. 3, 2012

(54) PHOSPHOR, PROCESS FOR PRODUCING THE SAME, AND LUMINESCENT DEVICE

(75) Inventor: Naoto Hirosaki, Ibaraki (JP)

(73) Assignee: National Institute for Materials Science, Tsukuba-shi (JP)

(*) Notice: Subject to any disclaimer, the term of this patent is extended or adjusted under 35 U.S.C. 154(b) by 684 days.

(21) Appl. No.: 12/096,601

(22) PCT Filed: Dec. 7, 2006

(86) PCT No.: PCT/JP2006/324478
§ 371 (c)(1),
(2), (4) Date: Mar. 20, 2009

(87) PCT Pub. No.: WO2007/066733
PCT Pub. Date: Jun. 14, 2007

(65) Prior Publication Data
US 2011/0121234 A1    May 26, 2011

(30) Foreign Application Priority Data
Dec. 8, 2005   (JP) .................................. 2005-355472

(51) Int. Cl.
*C09K 11/64*   (2006.01)
*C09K 11/08*   (2006.01)

(52) U.S. Cl. ................................. 252/301.4 F

(58) Field of Classification Search ............ 252/301.4 F; 313/503, 582, 584, 486, 467; 257/98
See application file for complete search history.

(56) References Cited

U.S. PATENT DOCUMENTS

| 7,544,310 B2 * | 6/2009 | Hirosaki ................ 252/301.4 F |
| 2006/0192178 A1 | 8/2006 | Hirosaki |
| 2007/0007494 A1 | 1/2007 | Hirosaki |
| 2007/0018567 A1 | 1/2007 | Hirosaki |
| 2007/0108896 A1 | 5/2007 | Hirosaki |
| 2007/0166218 A1 | 7/2007 | Hirosaki |
| 2009/0129052 A1 | 5/2009 | Hirosaki |
| 2009/0153028 A1 | 6/2009 | Hirosaki |

FOREIGN PATENT DOCUMENTS

| EP | 0 155 047 A1 | 9/1985 |
| JP | S60-206889 A | 10/1985 |
| JP | 2002-363554 A | 12/2002 |
| JP | 2005-048105 A | 2/2005 |
| JP | 2005-112922 A | 4/2005 |
| JP | 2005-117057 A | 4/2005 |
| JP | 3668770B B | 7/2005 |
| JP | 2005-255895 A | 9/2005 |
| JP | 2005-306692 A | 11/2005 |
| JP | 2005-307012 A | 11/2005 |
| JP | 2007-031201 A | 2/2007 |
| WO | WO 2005/019376 A1 | 3/2005 |
| WO | WO 2005/052087 A1 | 6/2005 |
| WO | 2005/087896 A | 9/2005 |
| WO | WO 2005/087896 * | 9/2005 |

* cited by examiner

*Primary Examiner* — Carol M Koslow
(74) *Attorney, Agent, or Firm* — Trojan Law Offices

(57) ABSTRACT

A green phosphor for emitting light, a spectrum of which is sharp, in an ultraviolet and visible light region, which has higher green light brightness than the conventional rare earth-activated sialon phosphor and has higher durability than the conventional oxide phosphor, is provided. The phosphor being characterized in that Al and a metal element M (here, M is Eu) are incorporated into a crystal of a nitride or oxynitride having a β-type $Si_3N_4$ crystal structure as a solid solution, the content of oxygen in the crystal does not exceed 0.8% by mass, and the phosphor emits a visible light having a luminescence peak wavelength in the range of 450 nm to 650 nm upon exposure to an excitation source is provided. This luminescence spectrum has a sharp spectrum shape. A manufacturing method of the phosphor, a lighting device and an image display device utilizing the phosphor are also provided.

11 Claims, 10 Drawing Sheets

PHOSPHOR, PROCESS FOR PRODUCING THE SAME, AND LUMINESCENT DEVICE

CROSS-REFERENCE TO RELATED APPLICATIONS

The present application is a U.S. National Stage Application under 35 U.S.C. 371 of PCT/JP2006/324478, filed on Dec. 7, 2006, which claims priority to Japanese Patent Application 2005-355472, filed on Dec. 8, 2005.

BACKGROUND OF THE INVENTION

1. Field of the Invention

The present invention relates to a phosphor which emits a visible light upon excitation by an ultraviolet ray, a visible light, or an electron beam and has a β-type $Si_3N_4$ crystal structure, wherein the luminescence peak has a small half-value width and a sharp peak shape, a manufacturing method of the phosphor, and a luminescence device utilizing the phosphor.

2. Background Art

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a white light-emitting diode (LED: Light-Emitting Diode), and so on. In any of these applications, it is necessary to provide the phosphor with energy to excite the phosphor in order to have the phosphor emit the fluorescence and the phosphor is excited by an excitation source with high energy such as a vacuum ultraviolet ray, an ultraviolet ray, an electron beam, and a blue light so as to emit a visible light ray. However, the phosphor is exposed to such excitation source that the luminance of the phosphor tends to deteriorate and lower the degree of the brightness. Therefore, the phosphor having little degradation in the brightness is desired. Therefore, a sialon phosphor is proposed as a phosphor having little degradation in the brightness instead for the conventional phosphor such as silicate phosphor, phosphate phosphor, aluminate phosphor, sulfide phosphor, and so on.

As an example of this sialon phosphor is manufactured in the following manufacturing process as generally described below. First, silicon nitride ($Si_3N_4$), aluminum nitride (AlN), europium oxide ($Eu_2O_3$) are mixed with predetermined respective molar ratios and the resultant mixture is fired by a hot press method in one atmospheric pressure (0.1 MPa) of nitrogen atmosphere at 1700° C. for one hour (for example, refer to Patent reference 1). It is reported that α-sialon activated with Eu ion manufactured in the above process became a phosphor to emit a yellow light of wavelength range of 550 nm to 600 nm when it was excited by the blue light having a wavelength range of 450 to 500 nm.

Further, a blue phosphor activated by Ce having a host crystal of JEM phase ($LaAl(Si_{6-z}Al_z)N_{10-z}O_z$) (refer to Patent reference 2), a blue phosphor activated by Ce having a host crystal of $La_3Si_8N_{11}O_4$ (refer to Patent reference 3), and a red phosphor activated by Eu having a host crystal of $CaAlSiN_3$ (refer to Patent reference 4) are known.

As another sialon phosphor, a phosphor of β-type sialon doped with a rare earth element is also known (refer to Patent reference 5) and it is shown that phosphors activated by Tb, Yb, and Ag are those which emit a green light of 525 nm to 545 nm. However, a phosphor having a high emission intensity has not been obtained since the activation elements are not well incorporated in the host crystal as a solid solution, but reside in the boundary phase because the synthesis temperature is so low as 1500° C.

As a sialon phosphor to emit fluorescence of high brightness, β-type sialon phosphor doped with divalent Eu is also known (refer to Patent reference 6) and it is shown that it becomes a green phosphor.

[Patent Document 1] Specification of Japanese Patent No. 3,668,770
[Patent Document 2] WO 2005/019376
[Patent Document 3] Japanese Patent Application Publication No. 2005-112922
[Patent Document 4] WO 2005/052087
[Patent Document 5] Japanese Patent Application Publication No. S60-206889
[Patent Document 6] Japanese Patent Application Publication No. 2005-255895

In the application of a backlight for a liquid crystal display, only three colors: red, green, and blue are necessary, but other color elements are not necessary. Therefore, only three kinds of phosphors having sharp spectra of red, green, and blue are necessary for this application. It is hardly possible to find, in particular, a green phosphor to emit luminescence which exhibits a sharp peak and high color purity. The green phosphor of β-type sialon described in Patent reference 6 exhibits a relatively wide spectrum so that it is hardly to say the sharpness is enough.

BRIEF SUMMARY OF THE INVENTION

Disclosure of the Invention

Problem to be Solved by the Invention

An object of the present invention is to try to satisfy such demand and to provide a green phosphor that emits a green emission spectrum with narrower width than that of the conventional rare earth activated sialon phosphor and that has higher durability than the conventional oxide phosphor.

Means to Solve the Problem

The present inventor has found that some nitride including Eu, Si, Al, O, and N which has a specific composition range, a specific solid solution state, and a specific crystal phase becomes a phosphor that emits a fluorescent light having a fluorescent peak in a wavelength range from 520 nm to 550 nm after he devoted himself to the investigation in such a circumstance. That is, it has been found that a solid solution crystal being doped with divalent Eu as a luminescence center, having a nitride or oxynitride of a β-type $Si_3N_4$ crystal structure as the host crystal, having a composition in which oxygen content does not exceed 0.8 mass % becomes a phosphor that emits a fluorescence having a peak in the wavelength range of 520 nm to 550 nm and exhibiting a sharp luminescence spectrum with a half-value width 55 nm or less. Further, as a method of manufacturing such phosphor, a method to synthesize β-type sialon by using metal Si as a source of Si and nitriding the metal Si has been found. Further, a method to reduce oxygen content by heat-treating β-type silicon nitride raw material or β-type sialon phosphor in a reduction atmosphere has been found.

That is, the important discovery that a phosphor of a specific composition among sialon crystals having β-type $Si_3N_4$ crystal structure doped with Eu as a solid solution can be used as a phosphor that emits a green luminescence having a sharp spectrum upon excitation by an ultraviolet ray, a visible light, and an electron beam or an X-ray is made for the first time by the present inventor. The present inventor continued to intensively conduct the investigation on the basis of this discovery such that the present inventor has successfully found a phosphor to emit luminescence with a high brightness in a specific wavelength region, a manufacturing method of the phosphor, and a lighting device utilizing the phosphor. Details are described more specifically below.

(1) A phosphor comprising: a nitride or oxynitride crystal having a β-type $Si_3N_4$ structure including Al and metal element M (here, M is Eu) as a solid solution wherein oxygen content contained in the crystal is 0.8 wt % or less.

(2) The phosphor according to the above (1) wherein the phosphor emits luminance having a peak wavelength in a range of 520 nm to 550 nm upon irradiation of an excitation source.

(3) The phosphor according to the above (1) wherein the phosphor emits luminance having a peak wavelength in a range of 520 nm to 535 nm upon irradiation of an excitation source.

(4) The phosphor according to the above (1) wherein the phosphor emits luminance derived from divalent Eu upon irradiation of an excitation source and a half-value width of a peak of the luminance is 55 nm or less.

(5) A manufacturing method of a phosphor comprising: firing a raw mixture comprising: at least metal powder including Si; metal or inorganic compound thereof including Al; metal or inorganic compound thereof including M (here, M is Eu), in an atmosphere containing nitrogen in a temperature range of 1200° C. or higher and 2200° C. or lower.

(6) The manufacturing method of the phosphor according to the above (1), wherein the metal or inorganic compound thereof including Al is aluminum nitride powder, and wherein the metal or inorganic compound thereof including M is europium oxide powder.

(7) The manufacturing method of the phosphor according to the above (1), further comprising: firing the raw mixture powder in the atmosphere including nitrogen in a temperature range of 1200° C. or higher and 1550° C. or lower such that nitrogen content of the raw mixture is increased; and then, firing the raw mixture powder at a temperature of 2200° C. or less.

(8) A manufacturing method of a phosphor comprising: an oxygen content reduction step of reducing oxygen content and increasing nitrogen content in oxynitride phosphor powder having β-type $Si_3N_4$ crystal structure including Eu or powder including at least Eu, Si, Al, O, and N elements by heat-treating the powder in a reduction-nitridation atmosphere.

(9) A manufacturing method of a phosphor comprising: heat-treating silicon nitride raw powder in a reduction-nitridation atmosphere; adding raw powder containing at least Eu and Al to the treated powder in which oxygen content is reduced during the heat treatment; and firing the powder at a temperature of 2200° C. or lower after the addition.

(10) The manufacturing method of the phosphor according to the above (8) or (9) wherein the reduction-nitridation atmosphere contains ammonia gas, or mixed gas of hydrogen and nitrogen.

(11) The manufacturing method of the phosphor according to the above (8) or (9) wherein the reduction-nitridation atmosphere contains hydrocarbon gas.

(12) The manufacturing method of the phosphor according to the above (8) or (9) wherein the reduction-nitridation atmosphere contains mixed gas of ammonia gas and methane or propane gas.

(13) A lighting device comprising: a light-emitting diode (LED) or a laser diode (LD) to emit light of wavelength of 330 to 500 nm and a phosphor wherein the phosphor comprises a phosphor recited in the above (1).

(14) An image display device comprising: at least an excitation source and a phosphor wherein the phosphor is a phosphor recited in the above (1).

(15) The image display device according to the above (14) comprising: any one of a liquid display panel (LCD), a fluorescent display tube (VFD), a field emission display (FED), a plasma display panel (PDP), and a cathode-ray tube (CRT).

(16) The image display device according to the above (15) wherein the liquid display panel (LCD) comprises: a LED backlight, wherein the LED backlight comprises: the phosphor and a light-emitting diode (LED) to emit light of wavelength of 430 to 480 nm, and wherein the phosphor further comprises: a red phosphor comprising $CaAlSiN_3$ activated by Eu.

Effect of the Invention

A phosphor according to the present invention is excellent as a green phosphor that emits light having a sharp spectrum and narrower peak width than that of the prior art sialon phosphor since the phosphor includes a sialon crystal having β-type $Si_3N_4$ crystal structure as a main component and the oxygen content contained in the crystal is reduced to 0.8 mass % or lower. Even if the phosphor is exposed to the excitation source, the brightness of this phosphor is not lowered and nitride compound which leads to a useful phosphor to be utilized in the VFD, FED, PDP, CRT, and, white LED is provided.

Figure 1:
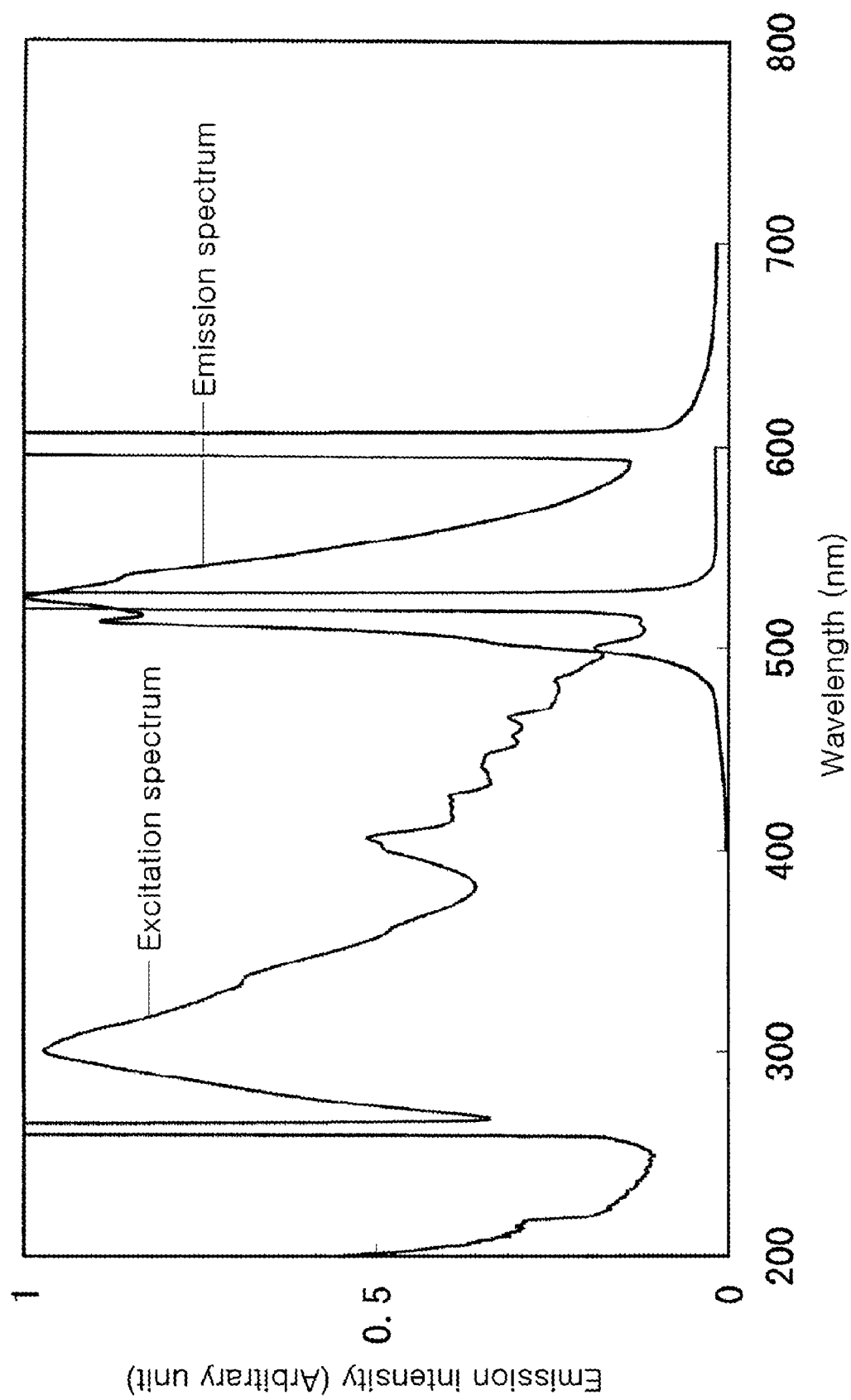
FIG. 1 shows an excitation spectrum and an emission spectrum by fluorescence measurement of Example 1.
Figure 2:
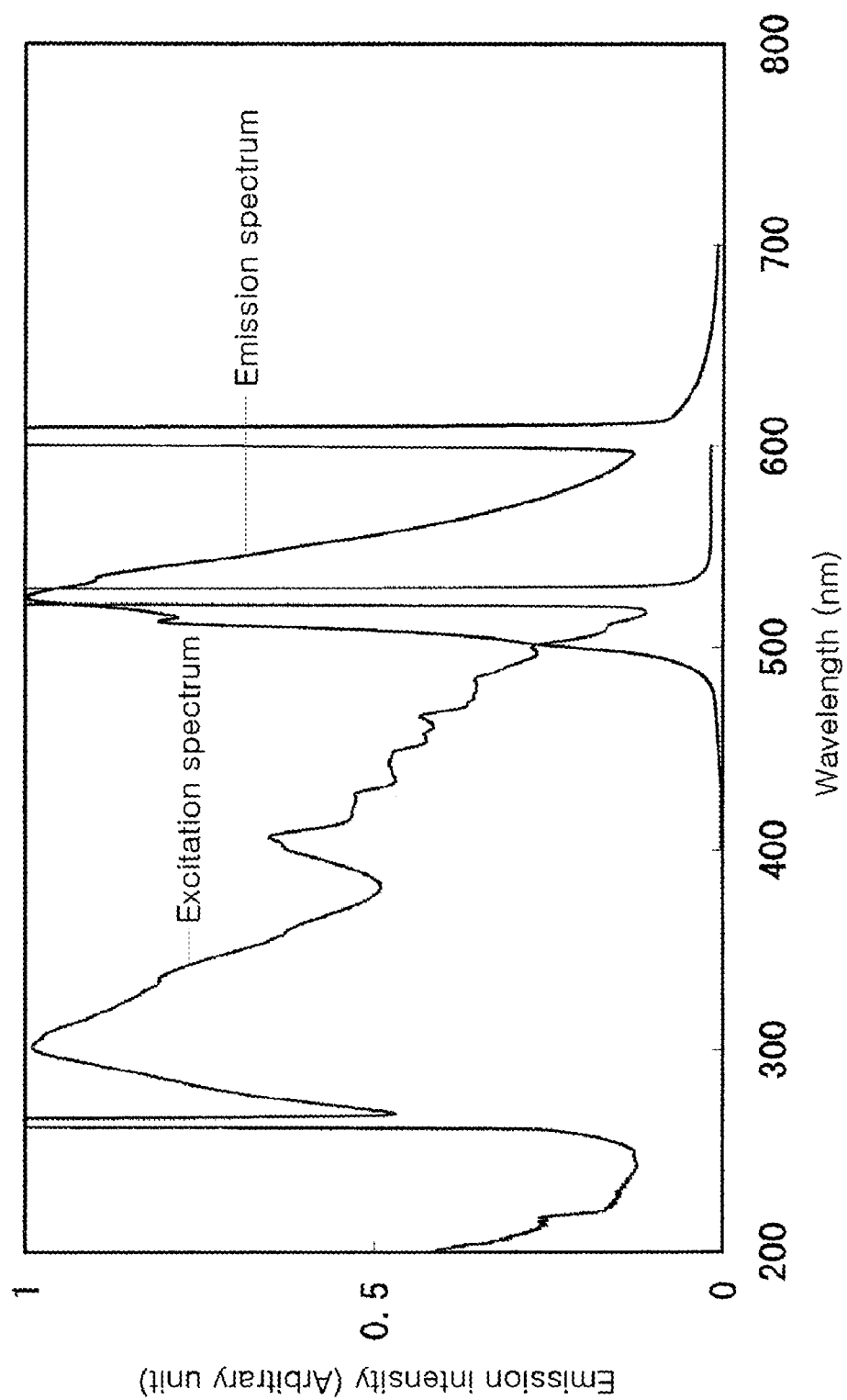
FIG. 2 shows an excitation spectrum and an emission spectrum by fluorescence measurement of Example 2.
Figure 3:
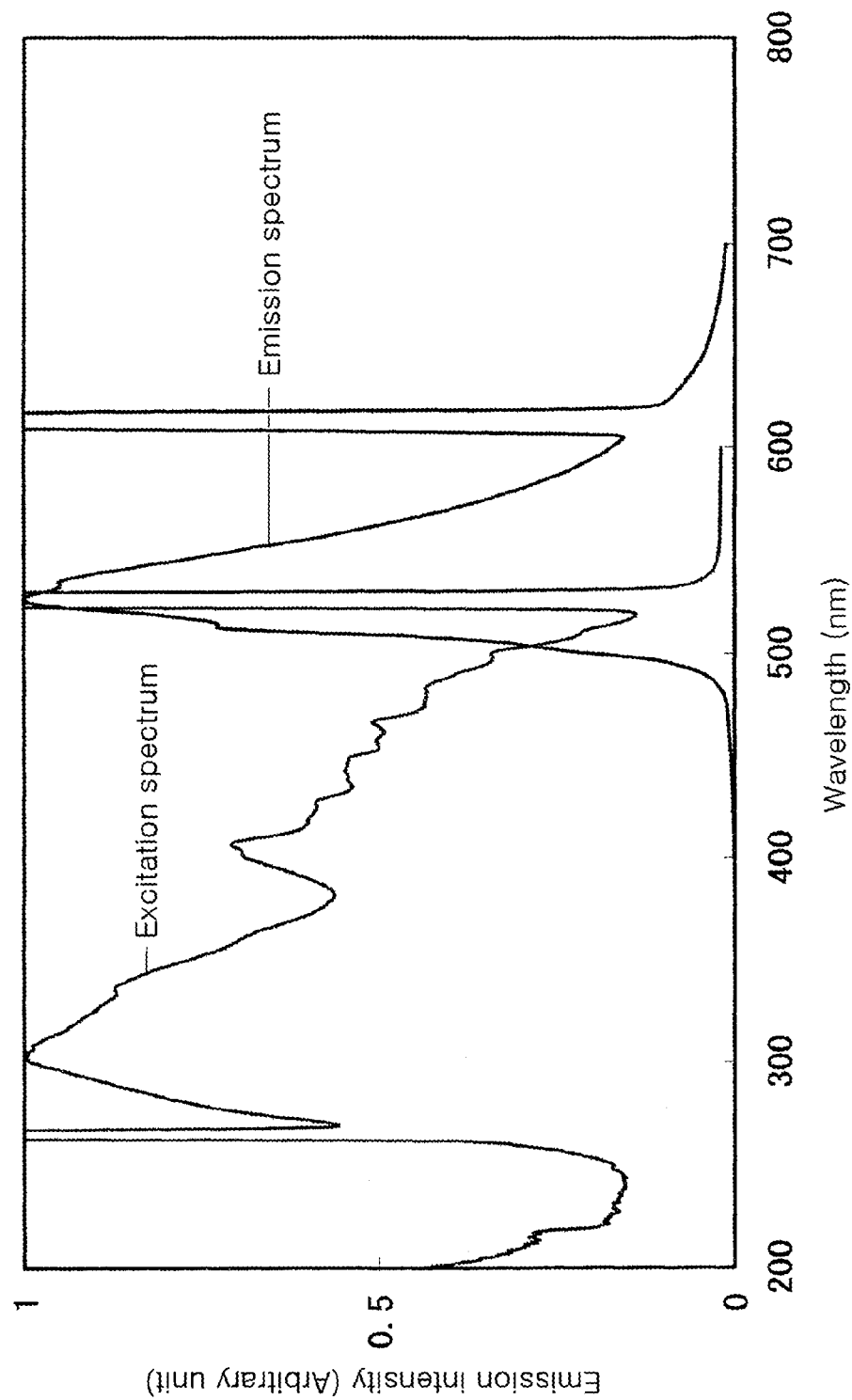
FIG. 3 shows an excitation spectrum and an emission spectrum by fluorescence measurement of Example 3.
Figure 4:
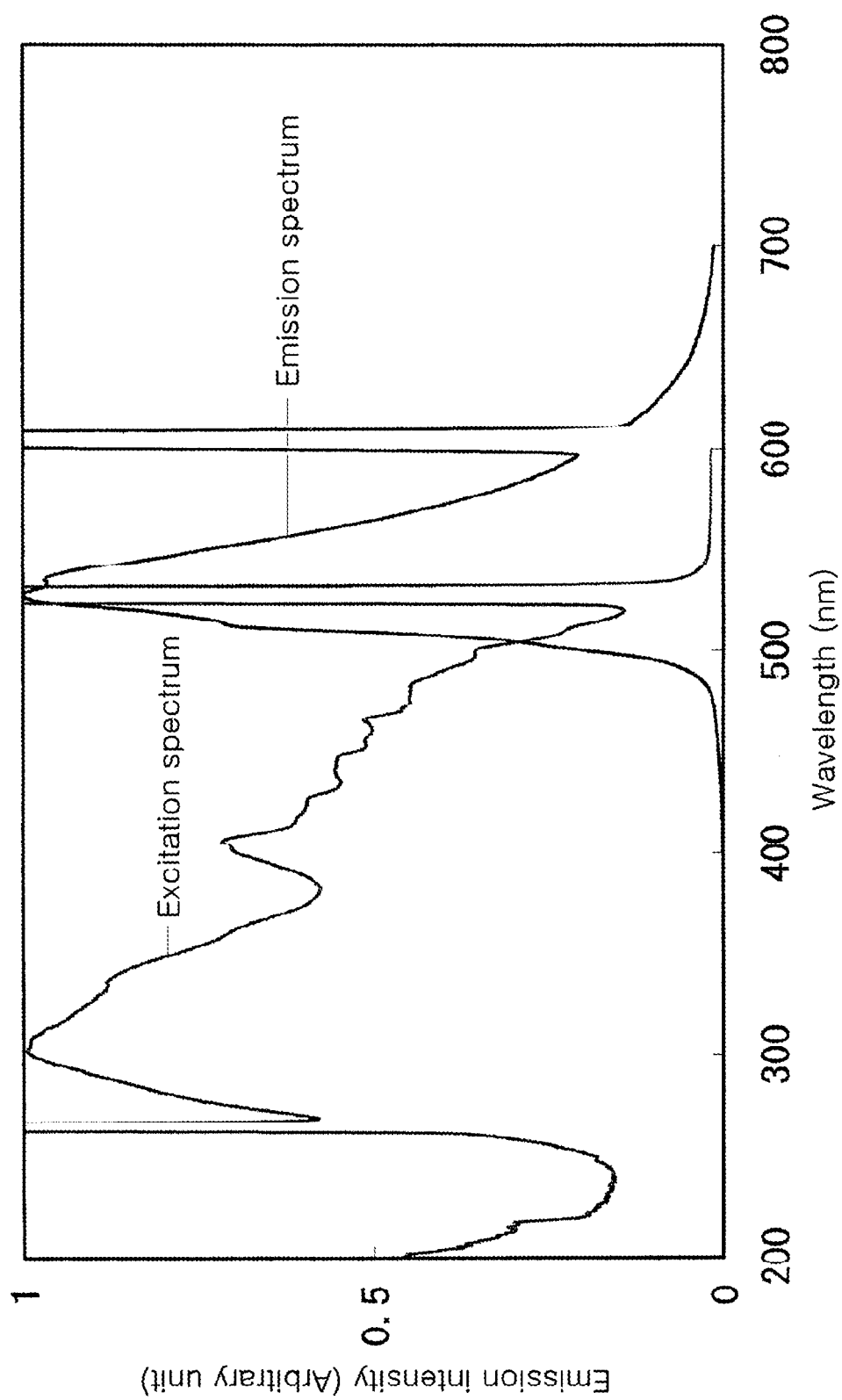
FIG. 4 shows an excitation spectrum and an emission spectrum by fluorescence measurement of Example 4.

| [Description Of Numerical References] | |
|---|---|
| 1 | mixture of red phosphor, blue phosphor, and green phosphor (Example 1) according to the present invention |
| 2 | LED chip |
| 3, 4 | conductive terminal |
| 5 | wire bond |
| 6 | resin layer |
| 7 | container |
| 8 | red phosphor |
| 9 | green phosphor |
| 10 | blue phosphor |
| 11, 12, 13 | ultraviolet-emitting cell |
| 14, 15, 16, 17 | electrodes |
| 18, 19 | dielectric layer |
| 20 | protection layer |
| 21, 22 | glass substrate |
| 51 | glass |
| 52 | cathode |
| 53 | anode |
| 54 | gate |
| 55 | emitter |
| 56 | phosphor |
| 57 | electron |
| 70 | LED backlight (backlight source) |
| 71 | polarizing filter |
| 72 | glass substrate |
| 73 | transparent electrode (common electrode) |
| 74 | transparent electrode (pixel electrode) |
| 75 | transparent electrode (for displaying red) |
| 76 | transparent electrode (for displaying green) |
| 77 | transparent electrode (for displaying blue) |
| 78 | liquid crystal molecular layer |
| 79 | color filters (for displaying red) |
| 80 | color filters (for displaying green) |
| 81 | color filters (for displaying blue) |

DETAILED DESCRIPTION OF THE INVENTION

Best Mode for Carrying Out the Invention

Hereafter, the present invention is described in detail.

The phosphor of this invention comprises a solid solution of a sialon having a β-type $Si_3N_4$ crystal structure (hereafter referred to as "β-type $Si_3N_4$ group crystal") as a main component. The β-type $Si_3N_4$ group crystal can be identified by X-ray diffraction or neutron beam diffraction, and in addition to a substance showing the same diffraction pattern as that of a pure β-type $Si_3N_4$, a crystal in which lattice constants have been changed by replacing a constituent element by another element also belongs to the β-type $Si_3N_4$ group crystal. Furthermore, point defects, plane defects, or stacking faults may be introduced into a crystal depending on a solid solution type, and a solid solution element may be condensed in a defective part in a particle. In that case, however, a crystal whose X-ray diffraction pattern does not change also belongs to the β-type $Si_3N_4$ group crystal. Further, a polytype having a long-period structure may be formed depending on periodicity of defect formation. In this case, however, a crystal whose basic structure is the β-type $Si_3N_4$ crystal structure also belongs to the β-type $Si_3N_4$ group crystal.

Here, the pure β-type $Si_3N_4$ crystal structure belongs to the hexagonal system having $P6_3$ or $P6_3/m$ symmetry and is a crystal defined as a structure having ideal atom positions. The position of each atom deviates from the ideal position by ±0.05 angstrom depending on the kind of the atom.

The lattice constants thereof are a=0.7595 nm and c=0.29023 nm. When its constituent Si is replaced by an element such as Al, N is replaced by an element such as O, or a metal atom such as Eu is introduced to form a solid solution, the lattice constants change. However, the basic crystal structure, sites occupied by the atoms, and atom positions designated by the coordinates do not change much. Therefore, once the lattice constants and the plane indices of the pure β-type $Si_3N_4$ are given, the positions of X-ray diffraction peaks (2θ) are uniquely determined. When the lattice constants calculated using X-ray diffraction results obtained for a new substance coincide with the data from diffraction peak positions (2θ) calculated using the plane indices of the pure β-type $Si_3N_4$, the crystal structure of the new substance is determined to be identical to that of the pure β-type $Si_3N_4$.

In the present invention, it is desirable from a viewpoint of fluorescence emission that a sialon crystal phase as a constituent component having the β-type $Si_3N_4$ crystal structure is as pure as possible and as much as possible. And the sialon crystal phase is preferably composed of a single phase. But it may also be composed of a mixture with other crystalline phases or amorphous phases in a range where phosphor characteristics do not deteriorate. In order to obtain the high brightness in this case, the content of the sialon crystal phase having the β-type $Si_3N_4$ crystal structure is preferably 50 mass % or more.

The phosphor has a sialon crystal having β-type $Si_3N_4$ crystal structure as a host crystal and expresses fluorescence properties by introducing a metal element M (here, M is Eu) into the host crystal as a solid solution such that M ion serves as a luminescence center to exhibit luminescence characteristics. The β-type sialon crystal containing metal element Eu as a solid solution in the host crystal emits a green fluorescence with the high brightness wherein divalent Eu serves as the luminescence center.

In the present invention, by adjusting the oxygen content of the sialon crystal having the β-type $Si_3N_4$ crystal structure to 0.8 mass % or less in a host crystal, a width of an emission peak can be decreased so as to sharpen the peak. A luminescence center ion such as Eu is surrounded by oxygen and nitrogen ions. Since the bonding state changes as Eu is bonded with the oxygen ion or the nitrogen ion, the emission wavelengths for the bonds with the oxygen and nitrogen ions are different. Accordingly, if the content of oxygen increases, it is considered that the width of the emission peak is increased. It is ideally preferable that the oxygen content is as low as possible since the peak width can be small. And this effect to make the peak width small is significant by adjusting the oxygen content to 0.8 mass % or less.

The phosphor to which Eu is added according to the present invention emits, upon irradiation of an excitation source, a green light which is derived from divalent Eu in a wavelength range of 520 nm to 550 nm and emits fluorescence of a sharp spectrum shape having a half-value width of 55 nm or less. In particular, the phosphor in which the oxygen content is decreased to 0.5 mass % or less emits a green light having a good color purity to form an emission spectrum with a peak at an emission wavelength in the range of 520 nm to 535 nm. Moreover, the green light has (x, y) values satisfying $0 \leq x \leq 0.3$ and $0.5 \leq y \leq 0.83$ on the CIE chromaticity coordinates so as to show the light is green and has a good color purity.

Fluorescent light with a high intensity may be emitted from the phosphor upon irradiation of light as an excitation source having the wavelength that is at least 100 nm and that does not exceed 500 nm (a vacuum ultraviolet ray, a deep ultraviolet ray, an ultraviolet ray, a near ultraviolet ray, a visible light from violet to blue regions) and an electron beam, an X-ray, and the like.

In particular, the shape of the phosphor according to the present invention is not limited to, but it is preferable that the phosphor is composed of a single crystal having the average particle size of 50 nm or larger and 20 μm or smaller if the phosphor is used in a powder state. Further, it is preferable that the average aspect ratio (a value to be given by dividing length of particle along the major axis by length of the particle along the minor axis) is equal to or less than 1.5 such that the particle is closer to the sphere since it is easy to handle the phosphor in the process of dispersion and application.

Here, in this specification, the mean particle diameter is defined as follows. In the measurement by the sedimentation method, the particle diameter is defined as a diameter of an equivalent sphere having the same sedimentation rate, and in the laser scattering method, it is defined as a diameter of an equivalent sphere having the same scattering characteristics. Further, the distribution of particle diameters is called a particle size (particle diameter) distribution. In the particle diameter distribution, a specified particle diameter is defined as a mean particle diameter D50 when the total mass of powder particles having diameters larger than the specified particle diameter is 50% of the total mass of the entire powder body. These definition and term are well known to the one skilled in the art and are described in various documents such as JIS Z 8901 "Powder Body for Test and Particle for Test" and the first chapter of "Basic Physical Properties of Powder" edited by The Society of Powder Technology, Japan (ISBN4-526-05544-1). In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As to a means for determining the mean particle diameter, various kinds of means have been developed and the development is still being performed such that the value measured by a newly developed means may differ slightly. However, it should be understood that the meaning and significance of the mean particle diameter itself is definite, and the means for measuring the mean particle diameter is not necessarily limited to the above-mentioned means.

The method for producing the phosphor of the present invention is, in particular, not limited to, but the following method may be described as an example.

When a raw material mixture comprising at least metal powder containing Si, metal or inorganic compound containing Al, and metal or inorganic compound containing metal element M (here, M is Eu) is fired in a temperature range of 1200° C. or higher and 2200° C. or lower in a nitrogen-containing atmosphere, a phosphor in which M is incorporated as a solid solution into a sialon crystal having the β-type $Si_3N_4$ crystal structure can be synthesized.

As a Si source of the raw material mixture, metal powder containing at least Si is used. As the metal powder containing Si, in addition to metallic Si, a Si alloy including another metal may be cited. As the Si source, an inorganic substance, such as silicon nitride or sialon powder, can be simultaneously added in addition to the metal powder. If the silicon nitride or sialon powder is added, the crystallinity of a product is improved although the oxygen content increases, and therefore the brightness of the phosphor is improved. As an Al source of the raw material mixture, a metal or inorganic compound containing Al is used. Metal Al, Al alloy, or aluminum nitride may be cited as an example. As a source of supplying the element M of the raw material mixture (here, M is Eu), metal M, or an alloy, nitride, oxide, or carbonate containing M may be cited. In order to decrease the oxygen content as low as possible, metal M or nitride of M is desirably used. Nevertheless, the oxide of M may be favorably used in a viewpoint of the industry because the raw material is readily available.

As the raw material mixture for synthesizing the phosphor containing Eu, a mixture of metal Si powder, aluminum nitride powder, and europium oxide powder may be cited. By using the raw material mixture of these powders, it is possible to synthesize such phosphor having a particularly low oxygen content.

The phosphor is synthesized by firing the raw material mixture in the nitrogen-containing atmosphere in a temperature range of 1200° C. or higher and 2200° C. or lower. The nitrogen-containing atmosphere is nitrogen gas, or a gas of molecule containing a nitrogen atom, and may be mixed with another kind of gas if necessary. For example, $N_2$ gas, $N_2$—$H_2$ gas mixture, $NH_3$ gas, and $NH_3$—$CH_4$ gas mixture may be cited. If heated under these atmospheres, the metal Si in the raw material is nitrided to form $Si_3N_4$, and then this $Si_3N_4$ is reacted with an Al-containing raw material and a M-containing raw material such that the phosphor including the sialon crystal having the β-type $Si_3N_4$ crystal structure in which M is incorporated as a solid solution is produced. In this production process, the phosphor having a low oxygen content may be synthesized since the content of oxygen in the metal Si (normally 0.5 mass % or less) is lower than the content of oxygen in $Si_3N_4$ raw material powder (normally 1 mass % or more). Here, it is preferable that the nitrogen-containing atmosphere is an atmosphere that includes substantially no oxygen, that is, the atmosphere is nonoxidizing.

A nitriding reaction of Si in the raw material powder mixture proceeds at a temperature of 1200° C. or higher and 1550° C. or lower. Therefore, it is possible to employ a technique to synthesize the phosphor comprising the steps of: firing the raw material powder mixture in this temperature range such that the nitrogen content in the raw material powder mixture is increased to convert Si into $Si_3N_4$; and firing the resultant product at a temperature of 2200° C. or lower.

As another synthesis method, it is possible to employ another technique to synthesize the phosphor comprising the steps of: heat-treating precursor raw material mixture powder containing at least Eu, Si, Al, O, and N elements or silicon nitride raw material powder in a reduction-nitridation atmosphere such that the oxygen content is lowered as the nitrogen content is increased in the treated powder, thereby decreasing the content of oxygen in the starting material; and firing the resultant mixture, to which a raw material including Eu or Al is added if necessary, at a temperature of 2200° C. or lower.

The reduction-nitridation atmosphere is composed of gas which has reduction ability and nitriding nature, such as ammonia gas, hydrogen and nitrogen gas mixture, ammonia-hydrocarbon gas mixture, and hydrogen-nitrogen-hydrocarbon gas mixture. Moreover, as a hydrocarbon gas, methane gas or propane gas is preferable because of the strong reduction ability. Furthermore, it is also possible to heat-treat, in a gas having the nitriding nature, a mixture material of the silicon nitride powder and the precursor raw material mixture powder to which, as a carbon source, solid material containing carbon such as carbon powder and liquid material containing carbon such as phenolic resin are added in advance.

In still another method, oxynitride phosphor powder having the β-type $Si_3N_4$ crystal structure and being doped with Eu may be heat-treated in a reduction-nitridation atmosphere so as to decrease the oxygen content and simultaneously increase the nitrogen content in the treated powder. In this method, a sialon phosphor synthesized by an ordinary method may be reduced and nitrided to decrease effectively the content of oxygen residing on the surface of the sialon phosphor.

In this method, the reduction-nitridation atmosphere is also the gas having the reduction ability and the nitriding nature. For example, ammonia gas, hydrogen and nitrogen gas mixture, ammonia-hydrocarbon gas mixture, or hydrogen-nitrogen-hydrocarbon gas mixture may be cited. Moreover, as the hydrocarbon gas, methane or propane gas is preferable because of the strong reducing ability.

In the step of synthesizing the phosphor, particularly high brightness can be obtained according to a method of firing a metal compound in a powder or aggregate state which is filled in a container as the packing fraction is maintained to keep the bulk density of the metal compound 40% or less. When using fine powder having a particle diameter of several micrometers as the starting material, the mixture of the metal compound after completion of the mixing step is in an aggregated form (hereafter referred to as a "powder aggregate") of several hundreds micrometers to several millimeters, which is constituted of the fine powder having the particle diameter of several micrometers. In the present invention, the powder aggregate is fired in a state where the packing fraction of the powder aggregate is maintained so as to keep the bulk density 40% or less.

More specifically, in an ordinary sialon production, powder is fired by the hot pressing method or the power is first molded in a die and then fired. Therefore, the powder is fired in a state of a high packing fraction. In the present invention, however, no mechanical force or no in-advance molding using a mold or the like is applied, and a mixture powder aggregate whose particle size is uniformized is filled, as it is, in the container or the like by maintaining the packing fraction so as to keep the bulk density 40% or less. If necessary, the particle size may be controlled by granulating the powder aggregate to a mean particle diameter of 500 μm or smaller using a sieve, air classification or the like. Alternatively, the powder aggregate may be directly granulated into a size of 500 μm or smaller using a spray dryer or the like. Furthermore, the container made of boron nitride is advantageous because boron nitride hardly reacts with the phosphor.

The reason why the firing is performed while the bulk density is kept 40% or less is to fire the raw material powder in the state of keeping a free space around the raw material powder. The optimal bulk density depends on the shape or surface state of granular particles, and it is preferably 20% or less. In this state, a reaction product can grow as a crystal growth in the free space such that it is less likely for the growing crystals to contact with each other. It is plausible that the crystals having fewer surface defects can be synthesized as a result. Thus, the phosphor having high brightness is obtained. If the bulk density exceeds 40%, partial densification may occur during the firing, resulting in a dense sintered compact which hinder the crystal growth such that the brightness of the phosphor may be decreased. Moreover, fine powder material is hardly to be obtained. Further, it is particularly preferable to adjust the size of the powder aggregate to 500 μm or smaller to obtain excellent milling properties after firing.

As described above, the powder aggregate having the packing fraction of 40% or less is fired under the abovementioned conditions. A furnace of a metal resistance heating type or graphite resistance heating type is preferable for the firing because the firing temperature is high and the firing atmosphere is nitrogen. Further, an electric furnace using carbon as material for hot parts of the furnace is suitable. As a method of firing, a sintering method which does not need application of mechanical pressurization from the outside, such as a pressureless sintering process and a gas-pressure sintering process, is preferable to perform the firing while the bulk density is kept in a predetermined range.

In the step of synthesizing the phosphor, the nitrogen atmosphere preferably has a pressure in the range of 0.1 MPa or higher and 100 MPa or lower. The pressure is more preferably in the range of 0.1 MPa or higher and 1 MPa or lower. If the nitrogen gas atmosphere has a pressure lower than 0.1 MPa when silicon nitride is used as the raw material and heated at a temperature of 1820° C. or higher, the raw material is easily decomposed by heat, which is not so preferable. If the pressure is higher than 0.5 MPa, the decomposition is significantly suppressed. A pressure of 1 MPa is sufficient for this purpose. A pressure of 100 MPa or higher is not suitable for industrial production because a special facilities are required.

When the powder aggregate obtained from firing is tightly sintered, the powder aggregate is ground with a milling machine usually used in industry, for example a ball mill and a jet mill. In particular, the control of the particle diameter is easy in ball mill. Balls and a pot used on this occasion are preferably made of a silicon nitride sintered compact or sialon sintered compact. The balls and the pot made of a ceramic sintered compact having the same composition as that of the phosphor to be produced is particularly preferable. Milling is applied until a mean particle diameter of 5 μm or smaller is obtained. In particular, the mean particle diameter is preferably 20 nm or larger and 5 μm or smaller. If the mean particle diameter exceeds 5 μm, the fluidity of the powder and the dispersibility of the powder into a resin deteriorate. Consequently, when forming a light emitting unit in combination with a light emitting device, emission intensity becomes non-uniform depending on a portion of the unit. If the mean particle diameter becomes smaller than 20 nm, the powder becomes poor in handling. When a target particle diameter is not obtained only by milling, classification can be combined. As a method of classification, a sieving process, air classification process, precipitation process in a liquid or the like may be employed.

As a part of the method of milling and classification, an acid treatment may be applied. In most powder aggregates obtained by firing, the nitride or oxynitride single crystals having the β-type $Si_3N_4$ crystal structure are tightly aggregated by a small amount of grain boundary phase including a glass phase as a main component. When the powder aggregate is immersed in an acid having a specific composition, the grain boundary phase including the glass phase as the main component selectively dissolves, and the single crystals separate. In this way, individual particles may be obtained as one nitride or oxynitride single crystal having the β-type $Si_3N_4$ crystal structure, but not as aggregate of single crystals. Since such a particle comprises a single crystal having fewer surface defects, the brightness of the phosphor is particularly increased.

Although the fine phosphor powder is obtained according to the above-mentioned steps, heat treatment is effective in order to further improve the brightness. In this case, the powder after the firing or after the particle size adjustment by milling or classification can be thermally treated at a temperature of 1000° C. or higher and the firing temperature or lower. In the case of the thermal treatment at the temperature lower than 1000° C., the effect of eliminating the defects on the surface is low. In the case of the thermal treatment at the temperature higher than the firing temperature, milled powder particles may be bonded again with each other, which is not so preferable. Although the atmosphere suitable for the heat treatment depends on the phosphor composition, a mixed atmosphere composed of one or two or more kinds of gases selected from nitrogen, air, ammonia, and hydrogen may be used. Since the nitrogen atmosphere is highly effective in eliminating the defects, it is preferable.

The nitride to be obtained as described above according to the present invention is capable of having a wider excitation range from an ultraviolet ray to a visible light as compared with an ordinary oxide phosphor or an existing sialon phosphor. Moreover, the nitride can emit the visible light, and in particular, the nitride to which Eu is added can emit the green light. Further, the nitride is characterized by a narrow emission spectrum width such that it is suitable for a backlight of an image display device. In addition, the nitride does not deteriorate even when exposed to a high temperature such that it is excellent in the thermal durability. The nitride is also excellent in the stability in an oxidizing atmosphere and a humid environment for a long period of time.

In the following, the present invention will be described in more detail using Examples as shown below. These examples, however, are disclosed as the help for understanding the present invention with ease, and the present invention shall not be limited to these Examples.

EXAMPLE

Examples 1 to 4

As powdery raw materials, Si powder which had 99.99% purity and was passed through a 45 μm-sieve (Kojundo Chemical Laboratory Co., Ltd., reagent grade), aluminum nitride powder having a specific surface area of 3.3 m$^2$/g and an oxygen content of 0.79% (Tokuyama Corp. F grade), and europium oxide powder of 99.9% purity (Shin-Etsu Chemical Co., Ltd.) were used.

Table 1 summarizes design compositions of Examples 1 to 4 and Comparative example. Table 2 summarizes the weights of individual components of Examples 1 to 4 and Comparative example which are weighed in order to obtain the respective design compositions in Table 1. To obtain compounds having the design compositions shown in Table 1 (Examples 1 to 4), predetermined amounts of powdery raw materials were weighed in a proportion of compositions in Table 2, mixed using a mortar and a pestle which were made of a silicon nitride sintered compact for 10 minutes or more, and then passed through a 250-μm sieve to obtain a powder aggregate having high fluidity. This powder aggregate was allowed to naturally fall into a crucible made of boron nitride having a diameter of 20 mm and a height of 20 mm. Next, the crucible was set in a graphite resistance heating-type electric furnace. Firing operations are described as follows. First, a firing atmosphere was evacuated with a diffusion pump, and heated from the room temperature to 800° C. at a rate of 500° C./h. Nitrogen gas having a purity of 99.999 vol % was introduced at 800° C. to set gas pressure to 0.5 MPa, and the temperature was raised to 1300° C. at a rate of 500° C./h, and then continuously raised to 1600° C. at a rat of 1° C./m, and maintained at the temperature for 8 hours. The synthesized sample was ground to powder using an agate mortar, and the powder X-ray diffraction measurement (XRD) using the Cu Kα line was conducted for the sample. As a result, all obtained charts showed existence of the β-type silicon nitride structure.

Next, the heat treatment was again applied to these powders. The powder fired at 1600° C. was ground using a mortar and a pestle which were made of silicon nitride, and then allowed to naturally fall into a crucible made of boron nitride having a diameter of 20 mm and a height of 20 mm. Next, the crucible was set in a graphite resistance heating-type electric furnace. Firing operations are described as follows. First, a firing atmosphere was evacuated with a diffusion pump, the furnace was heated from the room temperature to 800° C. at a rate of 500° C./h, nitrogen gas having a purity of 99.999 vol. was introduced at 800° C. to set gas pressure to 1 MPa, the temperature was continuously raised to 1900° C. at a rate of 500° C./h, and maintained at the temperature for 8 hours. The thus synthesized sample was ground to powder using an agate mortar, and the powder X-ray diffraction measurement (XRD) using the Cu Kα line was conducted for the sample. As a result, all obtained charts showed the existence of the β-type silicon nitride structure. The contents of oxygen and nitrogen in these synthetic powders were measured with an oxygen/nitrogen analyzer using a combustion process. The measurement results of Examples 1 to 4 and Comparative example are summarized in Table 3. As shown in Table 3, the oxygen contents in the synthetic powders of Examples 1 to 4 are 0.5 mass % or less.

Here, the oxygen contents shown in Table 3 are higher than those of the design compositions (if the oxygen contents are as expected from the design compositions in Table 1, the contents are to be 0.11 wt. %). The reason is considered as follows. The surfaces of silicon powder and aluminum nitride powder used as the starting materials might have been oxidized to form a silicon oxide film and an aluminum oxide film. Furthermore, when the raw materials were ground through the milling step and the drying step, the surfaces might have been oxidized so as to make the oxygen contents larger. Moreover, approximately 1 ppm of oxygen or moisture was also contained in the nitrogen gas atmosphere for firing at a high temperature, and this oxygen or moisture might have reacted with the samples, thereby making the oxygen contents higher. For these reasons, the oxygen contents shown in Table 3 are higher than those of the design compositions.

By irradiating the re-heat-treated powder samples with a lamp which emits light having a wavelength of 365 nm, it was confirmed that each of the powder samples emitted a green light. The emission spectra and excitation spectra of the powder samples were measured using a spectrophotofluorometer. Table 4 summarizes the results of Examples 1 to 4 and Comparative example. As shown in Table 4, the powder samples of Examples 1 to 4 were proved to be green phosphors having excitation spectrum peaks in the wavelength range of 300 nm to 303 nm and peaks in the wavelength range of 524 nm to 527 nm in the emission spectra. These samples have shorter peak wavelength values than those of green phosphors having β-type sialon as a host having been reported in the past and their emission spectra have a good color purity.

FIGS. 1 to 4 show the spectra of the re-heat-treated products of the examples. The phosphors are characterized by emitting sharp green lights having half-value widths of 55 nm or smaller. Since the emission intensity (counted values) changes depending on measuring instruments or conditions, the indicated unit is an arbitrary unit. In the drawings, the emission intensity of the peak observed in the range of 524 nm to 527 nm is normalized to 1.

Figure 5:
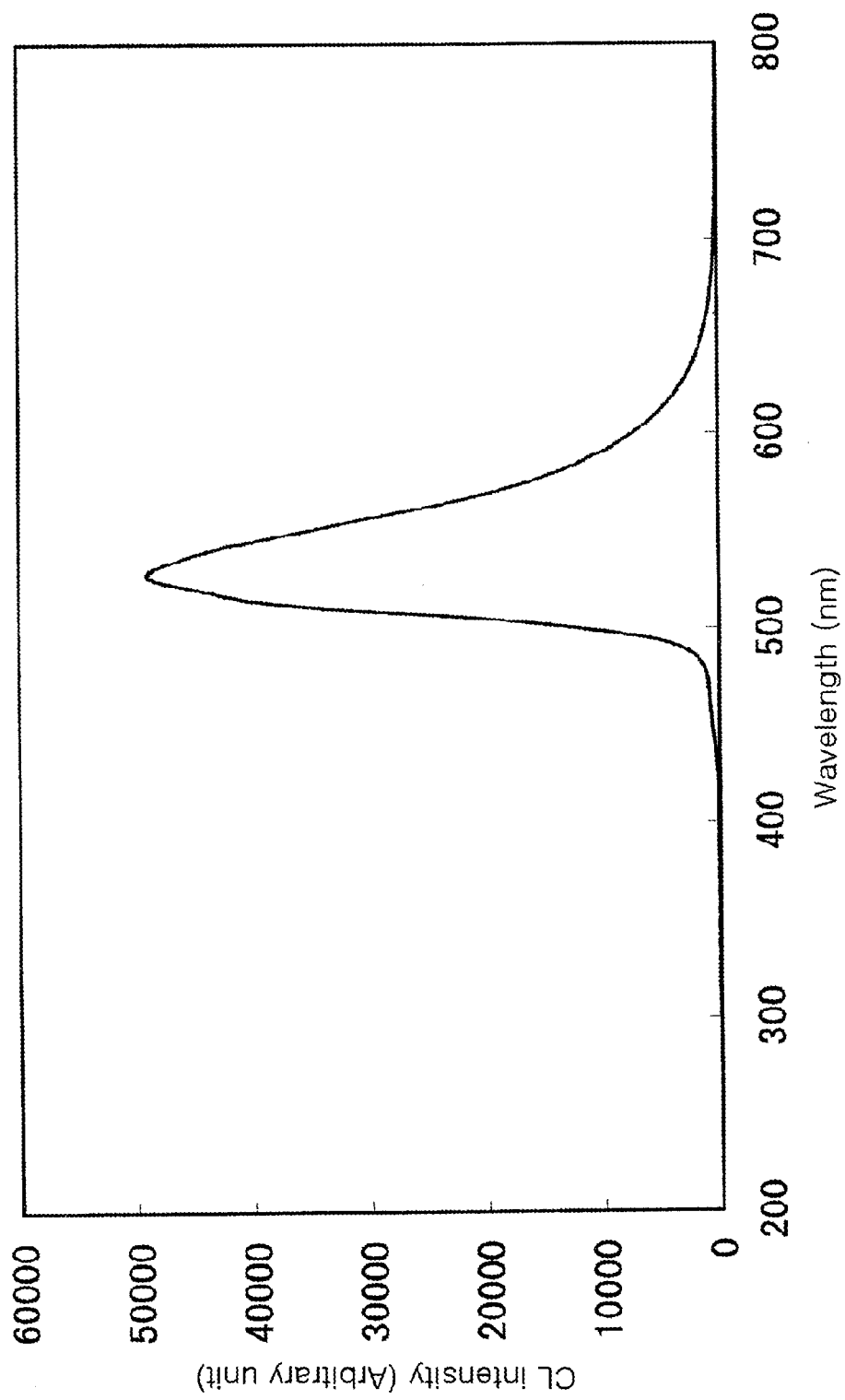
FIG. 5 shows an emission spectrum of Example 1 by CL emission.

Next, luminescence characteristics of Example 1 (cathodoluminescence, CL) obtained upon electron beam irradiation were observed using a scanning electron microscope (SEM) equipped with a CL detector, and CL images were evaluated. This apparatus shows clearly the wavelength of light emitted at any place by detecting visible light generated by the electron beam irradiation and obtaining the visible light as a photographic image being two-dimensional information. FIG. 5 shows the CL spectrum of Example 1 at an accelerating voltage of 5 kV. It is confirmed by emission spectrum observations that this phosphor was excited by the electron beam to emit a green light having a peak at 533 nm. The half-value width was 54 nm. Thus, the phosphor of the present invention has the peak in the wavelength range of 520 nm to 535 nm and a good color purity upon the electron beam irradiation, and thus it is suitable for the electron beam-excited image display device such as FED.

TABLE 1

|  | Designed Composition (Atomic ratio) | | | | |
| --- | --- | --- | --- | --- | --- |
|  | Eu | Si | Al | O | N |
| Example 1 | 0.0050 | 11.980 | 0.020 | 0.010 | 15.990 |
| Example 2 | 0.0150 | 11.940 | 0.060 | 0.030 | 15.970 |
| Example 3 | 0.0275 | 11.890 | 0.110 | 0.055 | 15.945 |
| Example 4 | 0.0350 | 11.860 | 0.140 | 0.070 | 15.930 |
| Comparative 1 | 0.0270 | 12.150 | 0.490 | 0.040 | 15.320 |

TABLE 2

|  | Mixture Composition (mass %) | | | |
| --- | --- | --- | --- | --- |
|  | $Si_3N_4$ | Si | AlN | $Eu_2O_3$ |
| Example 1 |  | 95.199 | 4.545 | 0.257 |
| Example 2 |  | 94.479 | 4.755 | 0.766 |
| Example 3 |  | 93.590 | 5.016 | 1.393 |
| Example 4 |  | 93.064 | 5.170 | 1.766 |
| Comparative 1 | 95.820 |  | 3.370 | 0.810 |

TABLE 3

|  | Contents of Oxygen and Nitrogen (mass %) | |
| --- | --- | --- |
|  | N | O |
| Example 1 | 38.8 | 0.32 |
| Example 2 | 39.0 | 0.33 |
| Example 3 | 39.1 | 0.40 |
| Example 4 | 38.9 | 0.42 |
| Comparative 1 | 38.7 | 1.12 |

TABLE 4

|  | Excitation Wavelength nm | Emission Wavelength nm | Half-value Width nm |
| --- | --- | --- | --- |
| Example 1 | 300 | 524 | 44 |
| Example 2 | 301 | 525 | 47 |
| Example 3 | 303 | 527 | 52 |
| Example 4 | 302 | 527 | 52 |
| Comparative 1 | 302 | 527 | 58 |

COMPARATIVE EXAMPLE

Comparative Example 1

Figure 6:
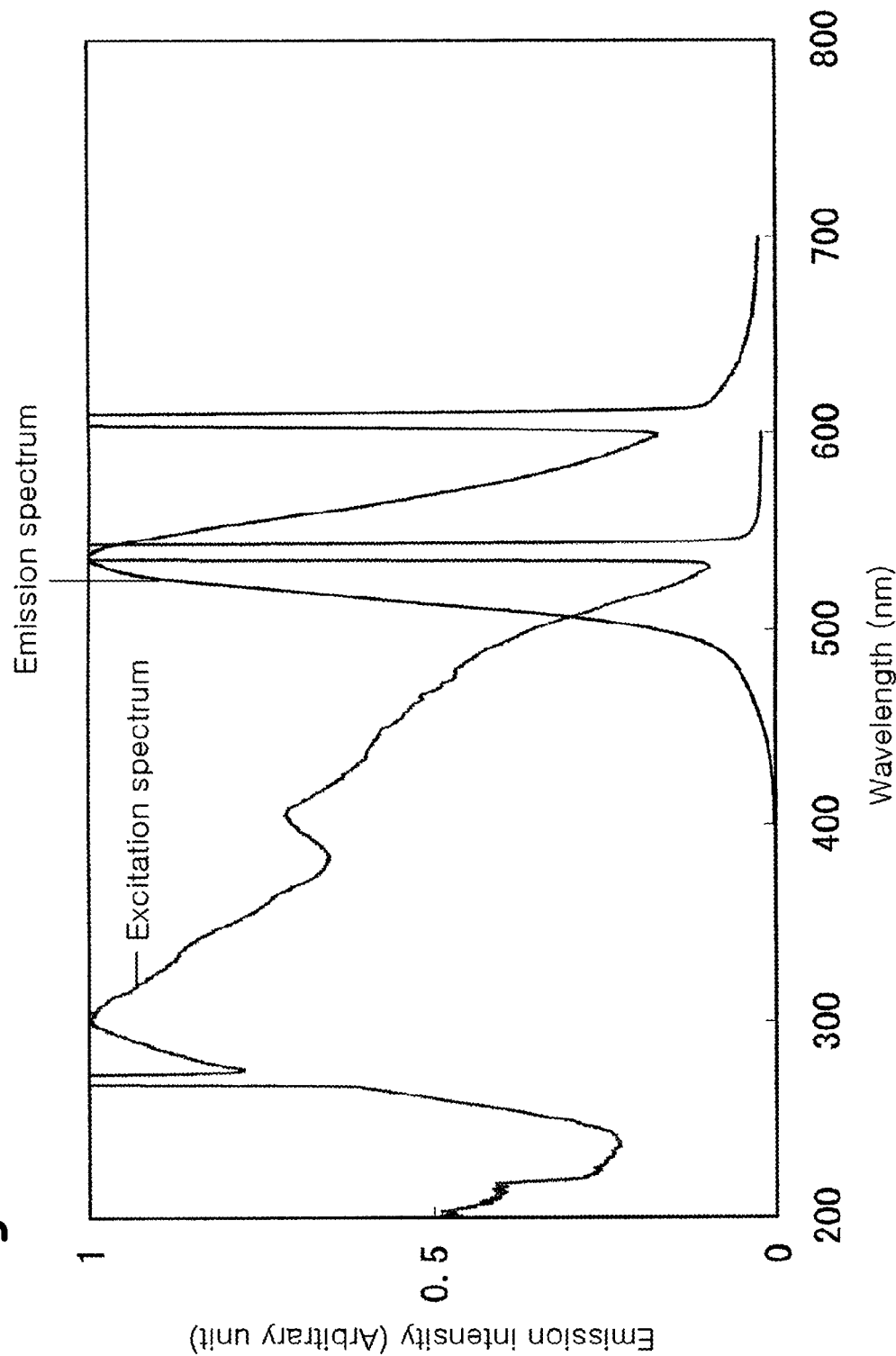
FIG. 6 shows an excitation spectrum and an emission spectrum by fluorescence measurement of Comparative example 1.

In order to obtain a compound having a design composition represented by $Eu_{0.027}Si_{12.15}Al_{0.49}O_{0.04}N_{15.32}$, the same powdery materials as use except Si powder, which was replaced by silicon nitride powder having an oxygen content of 0.93 wt % and an α-type content of 92% (Ube Industries, Ltd., SN-E10 grade). Predetermined amounts of silicon nitride powder, aluminum nitride powder and europium oxide powder were weighed in a proportion of 95.82 mass %, 3.37 mass % and 0.81 mass %, respectively, and mixed by using a mortar and a pestle which were made of a silicon nitride sintered compact for 10 minutes or more, and then passed through a 250-μm sieve, thereby obtaining a powder aggregate having high fluidity. This powder aggregate was allowed to naturally fall into a crucible made of boron nitride having a diameter of 20 mm and a height of 20 mm. Next, the crucible was set in a graphite resistance heating-type electric furnace, and then the firing atmosphere was evacuated with the diffusion pump and heated from the room temperature to 800° C. at a rate of 500° C./h. Nitrogen gas having a purity of 99.999 vol % was introduced at 800° C. to set gas pressure to 1 MPa, and the temperature was raised to 1900° C. at a rate of 500° C./h and maintained at the temperature for 8 hours. The synthesized sample was ground to powder using an agate mortar, and the powder X-ray diffraction measurement (XRD) using the Cu Kα line was conducted. As a result, all charts obtained showed the existence of the β-type silicon nitride structure. When the contents of oxygen and nitrogen in these synthetic powders were measured with an oxygen/nitrogen analyzer using a combustion process, as shown in Table 3, the oxygen content was 1.12 mass % and proved to be higher as compared with Example 1 in which the metal silicon was used as the starting material. The oxygen content of the silicon nitride powder is higher than the oxygen content of the metal silicon (in which the oxygen content in the raw material is 0.5 wt. % or less). Consequently, when the silicon nitride is used as the starting material, the oxygen content was proved to increase as compared with the powder in which the metal silicon powder was used as the starting material. As shown in FIG. 6, the fluorescence spectrum of this material has a longer emission wavelength of 537 nm and a wider half-value width of 58 nm, as compared with the material in which the metal silicon was used as the starting material.

Figure 7:
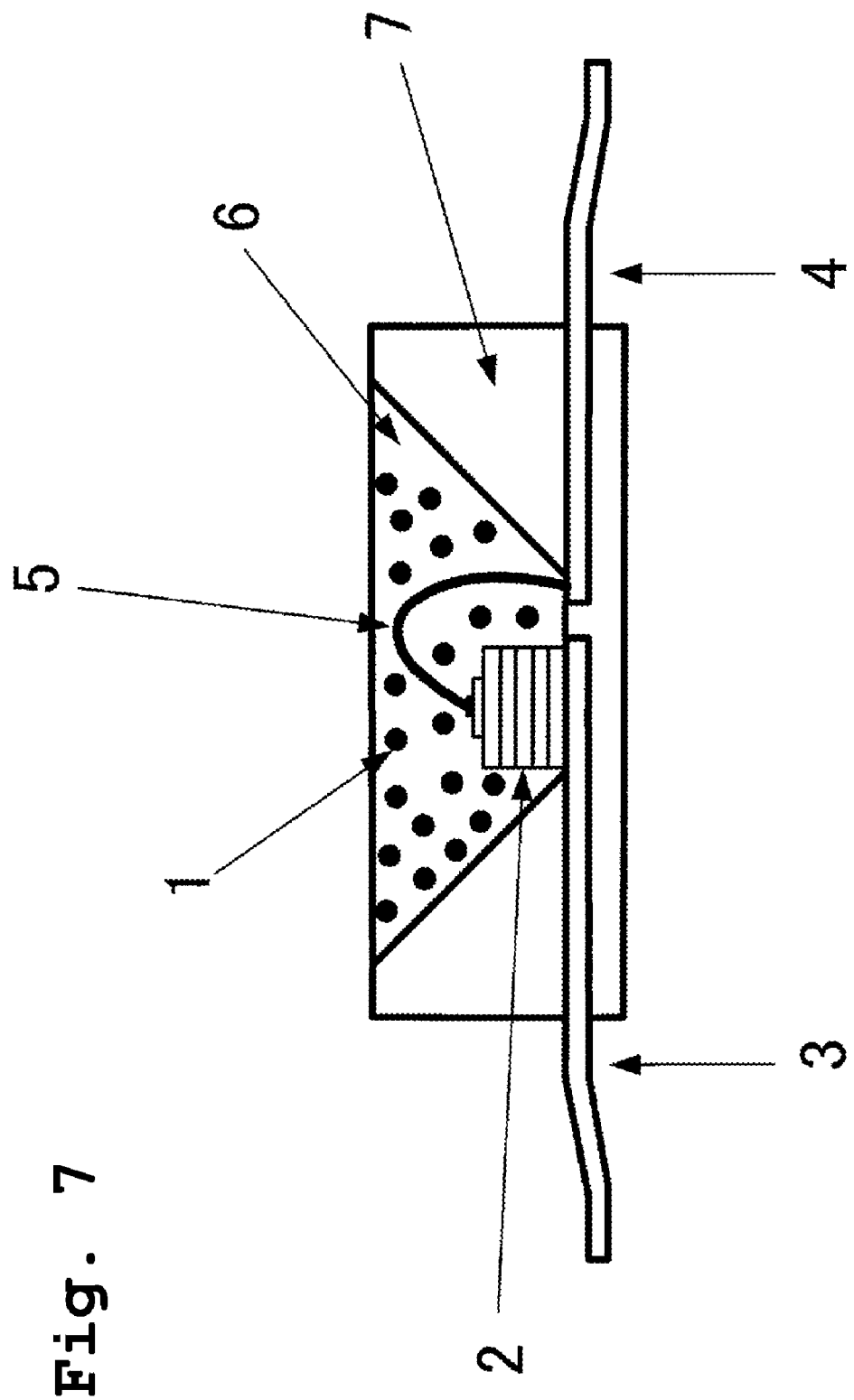
FIG. 7 is a schematic diagram showing a lighting device (LED lighting device) according to the present invention.

Next, a lighting device using the phosphor comprising the nitride of the present invention will be described. FIG. 7 is a schematic structural configuration of a white LED as the lighting device. A phosphor mixture 1 containing the nitride phosphor according to the present invention and other phosphors, and a 380 nm near-ultraviolet LED chip 2 as a light emitting device are used. A coating of the phosphor mixture 1 prepared by dispersing the green phosphor according to Example 1 of the present invention, a red phosphor (Y(PV)$O_4$:Eu) and a blue phosphor (BaMgAl$_{10}O_{17}$:Eu$^{2+}$ (BAM)) into a resin layer 6 is put on the LED chip 2, and arranged in a container 7. When electric currents flow through conductive terminals 3 and 4, the electric currents are supplied to the LED chip 2 via a wire bond 5. The LED chip 2 then emits light of 380 nm, which excites the phosphor mixture 1 of the green phosphor, red phosphor and blue phosphor to emit a green light, a red light, and a blue light. The green light, the red light, and the blue light are mixed to yield an illuminating device emitting a white light. This lighting device is characterized by high emission efficiency.

Figure 8:
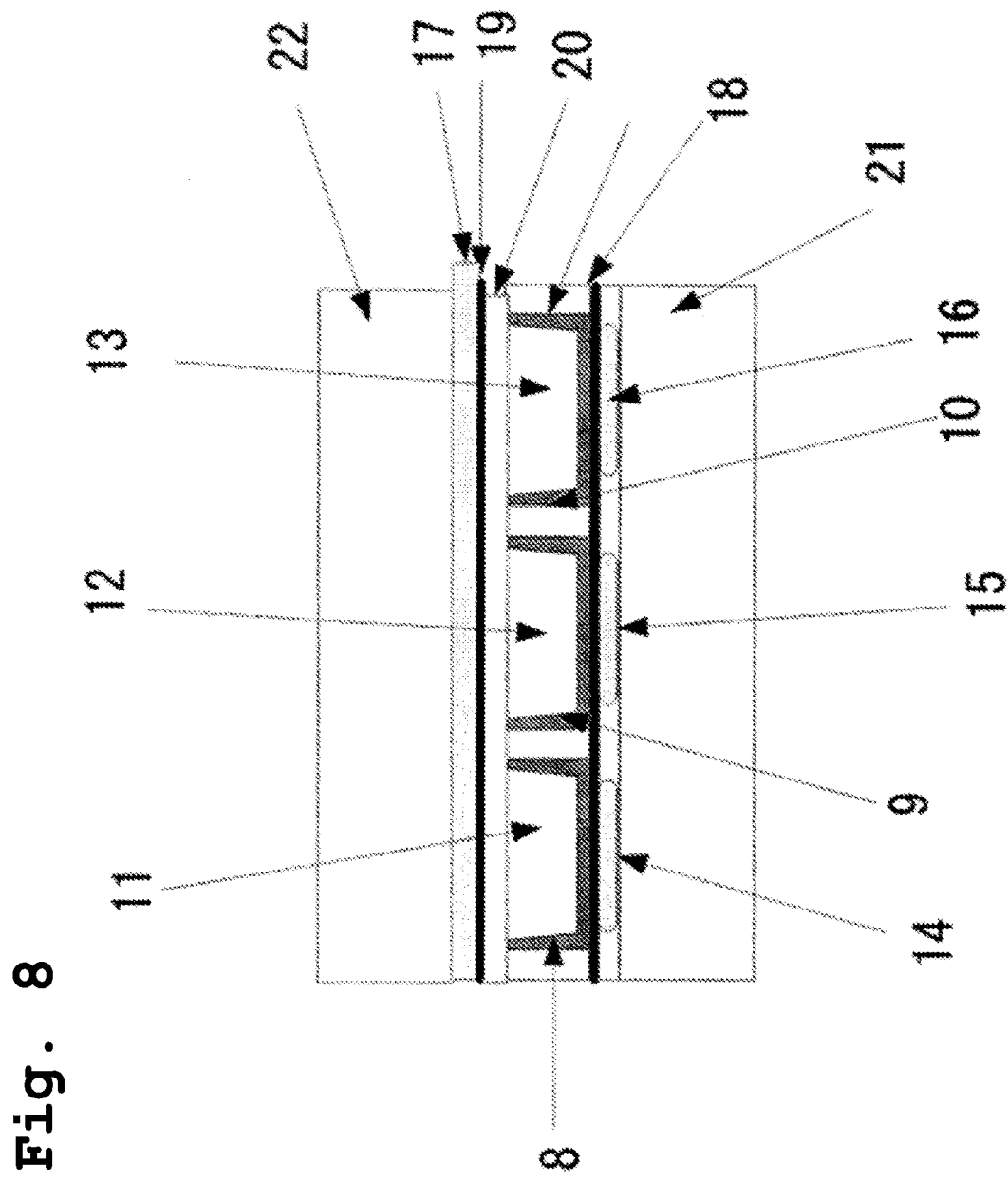
FIG. 8 is a schematic diagram showing an image display device (Plasma display panel) according to the present invention.

Next, an example of designing an image display device using the nitride phosphor of this invention will be described. FIG. 8 shows a schematic diagram showing a principle of a plasma display panel as an image display device. A red phosphor (Y(PV)$O_4$:Eu) 8, the green phosphor 9 of Example 1 according to the present invention and a blue phosphor (BaMgAl$_{10}O_{17}$:Eu$^{2-}$ (BAM)) 10 are applied to the internal surfaces of respective cells 11, 12 and 13. When electric currents are supplied to electrodes 14, 15, 16, and 17, vacuum ultraviolet radiation is generated by Xe discharge in the cells, and the phosphors are excited by this radiation to emit red, green and blue visible lights. The emitted lights are observed from the outside via a protection layer 20, a dielectric layer 19, and a glass substrate 22, so as to work as the image display.

Figure 9:
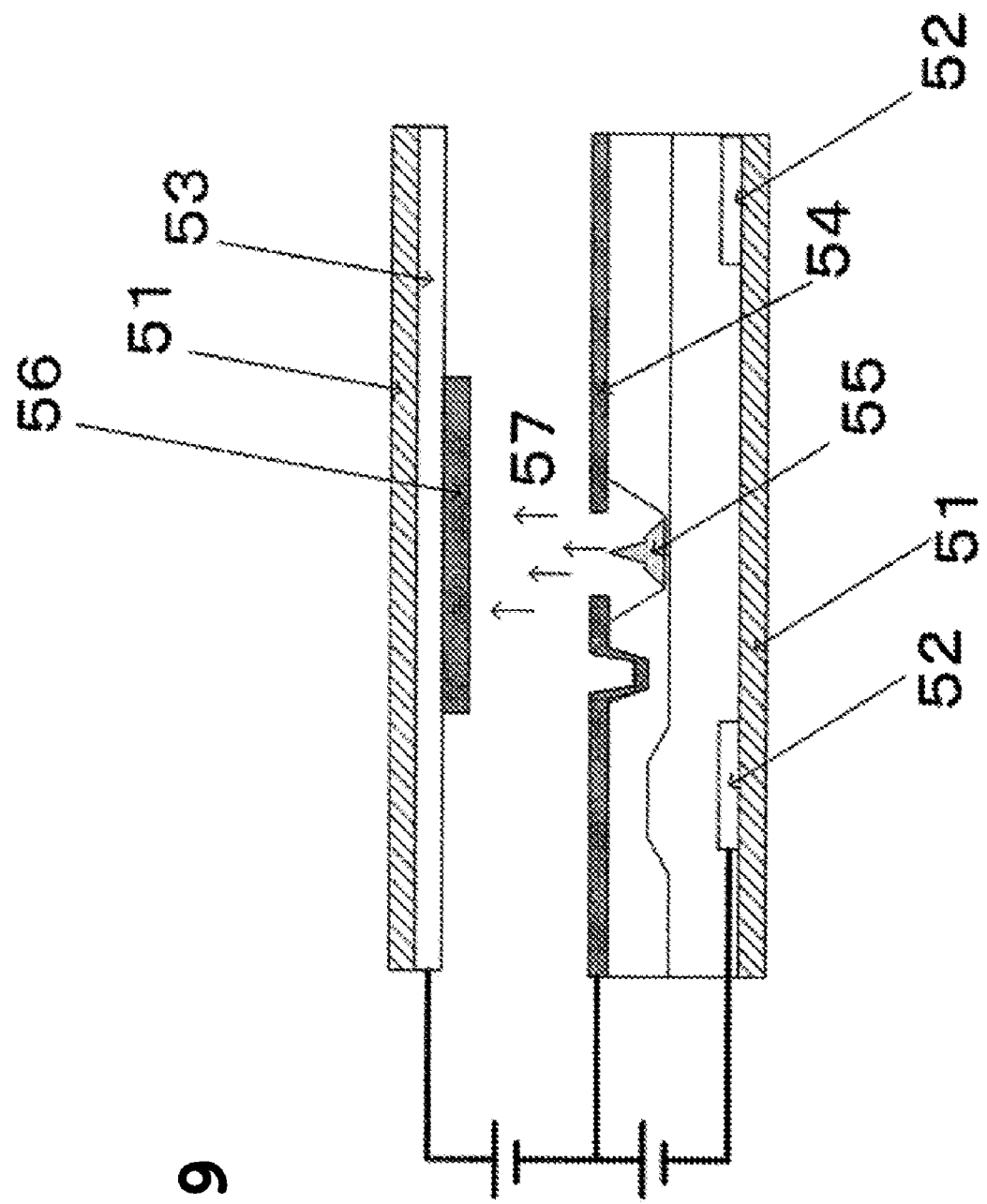
FIG. 9 is a schematic diagram showing an image display device (Field Emission Display) according to the present invention.

FIG. 9 is a schematic diagram showing a principle of a field emission display panel as an image display device. The green phosphor 56 of Example 1 according to the present invention is applied to the internal surface of an anode 53. By applying the voltage between a cathode 52 and a gate 54, electrons 57 are emitted from an emitter 55. The electrons are accelerated by the voltage between the anode 53 and the cathode and impinge on the phosphor 56 to excite the phosphor to emit light. The entire structure is protected by glass 51. The drawing shows a single light emission cell comprising one emitter and one phosphor. However, an actual display emitting a variety of colors is built by arranging a large number of blue and red cells besides green cells. Although the phosphors used for the green and red cells are not particularly specified, phosphors which show high brightness under low-voltage electron beams are preferable.

Figure 10:
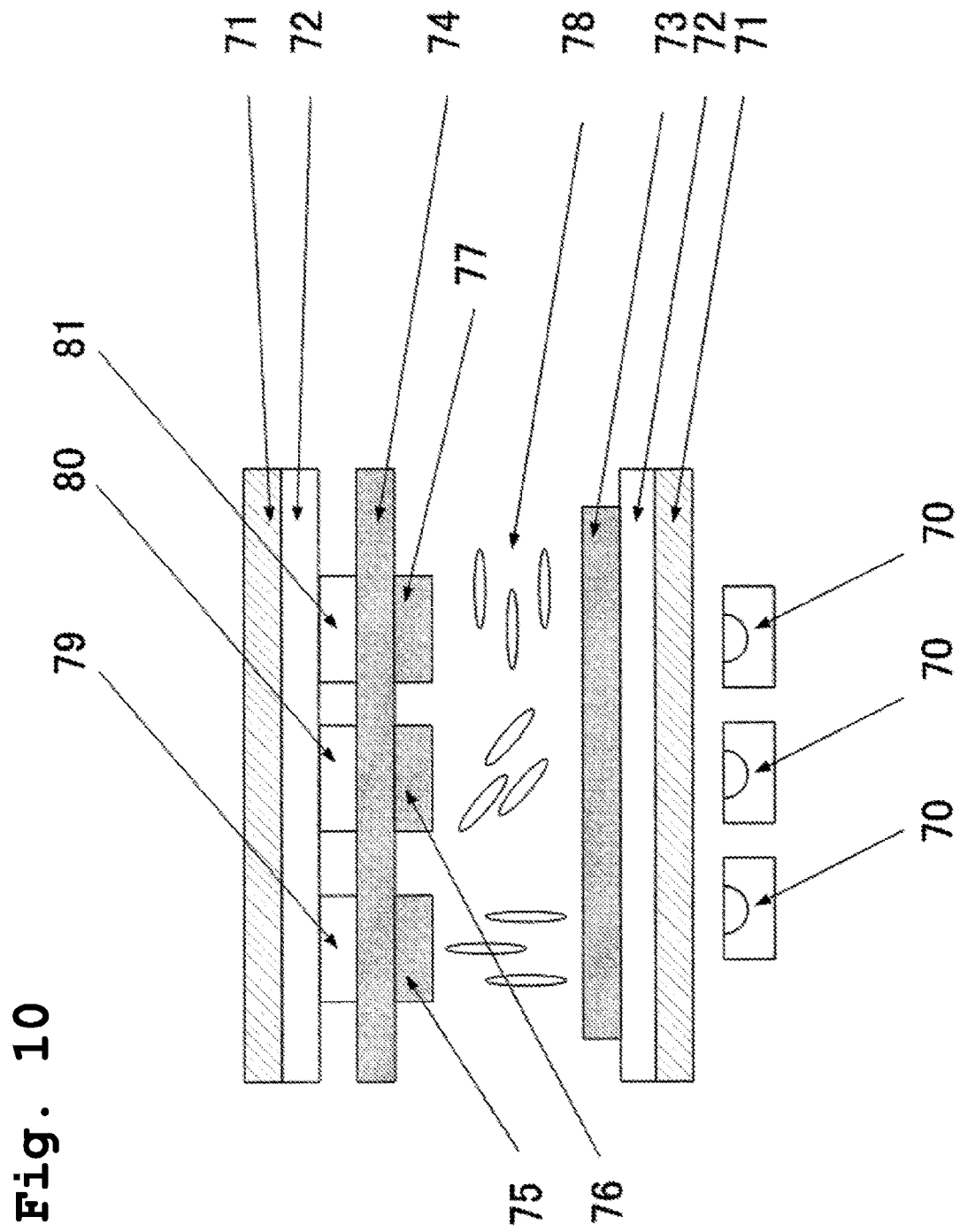
FIG. 10 is a schematic diagram showing an image display device (liquid crystal display panel) according to the present invention.

FIG. 10 is a schematic diagram showing a principle of a liquid crystal display panel as an image display device. The liquid crystal display panel comprises: a polarizing filter 71, a light shutter part including transparent electrodes 73 to 77 and a liquid crystal (liquid crystal molecular layer) 78, and backlight sources 70. A white LED having the structure shown in FIG. 7 is used as a backlight source 70. In FIG. 7, a phosphor mixture 1 containing the nitride phosphor according to the present invention and other phosphors, and a 450 nm blue LED chip 2 as a light emitting device are used. A coating of the phosphor mixture 1 prepared by dispersing the green phosphor according to Example 1 according to the present invention and a red phosphor ($CaAlSiN_3$:Eu) into a resin layer 6 is put on an LED chip 2, and arranged in a container 7. When electric currents flow through conductive terminals 3 and 4, the electric currents are supplied to the LED chip 2 via a wire bond 5. The LED chip then emits light of 450 nm, which excites the phosphor mixture 1 comprising: the green phosphor and the red phosphor to emit green and red lights, respectively. The light emitted by the phosphors and the blue light emitted by the LED are mixed to yield a white light. In FIG. 10, this LED chip is used as a LED backlight 70 for a backlight source. A mixture of red, green and blue lights emitted by the LED backlight 70 passes through a polarizing filter 71, a glass substrate 72 and a transparent electrode 73 to reach a liquid crystal molecular layer 78. The directions of liquid crystal molecules which are present in the liquid crystal molecular layer 78 are changed by the voltage applied between the transparent electrode 73 serving as a common electrode and transparent electrodes 75, 76 and 77 arranged on a pixel electrode 74 for displaying respective red, green and blue colors, and this change of molecular directions causes change in light transmission. Light beams having passed through the transparent electrodes 75, 76, and 77 further pass through red, green and blue color filters 79, 80, and 81, and are emitted outside through the glass substrate 72 and the polarizing filter 71. In this way, an image is displayed.

This backlight source 70 has a spectrum which comprises sharp blue, green and red light components and is hence excellently separated into the components by the polarizing filter 71. Therefore, red, green and blue chromaticity points of the spectrally separated light components have improved color purity on chromaticity coordinates. In this way, a color space reproducible by the liquid crystal display is made wider, and a liquid crystal panel having satisfactory color reproducibility can be provided.

INDUSTRIAL APPLICABILITY

The phosphor of the present invention is excellent as a green phosphor to emit a sharp light having a narrower peak-width if compared to that of the prior art sialon. Further, the phosphor shows only small deterioration of phosphor brightness when exposed to an excitation source. Hence, the phosphor is used suitably for VFD, FED, PDP, CRT, white LED, and the like. In the future, it is expected that the phosphor will be extensively utilized in performing the material design of various kinds of display devices such that it may contribute to the development of the industry.

While the foregoing describes the present invention in relation to illustrations and examples, it is understood that it is not intended to limit the scope of the invention to the illustrations and examples described herein. On the contrary, it is intended to cover all alternative modifications and equivalents that may be included in the spirit and the scope of the invention as defined by the appended claims.

What is claimed is:

1. A manufacturing method of a phosphor comprising: nitride or oxynitride crystal having a β-type $Si_3N_4$ structure including Al and Eu as a solid solution wherein oxygen content contained in the crystal is 0.8 wt % or less, the method comprising:
    firing a raw mixture comprising: at least metal powder including Si; metal or inorganic compound thereof including Al; metal or inorganic compound thereof including Eu, in an atmosphere containing nitrogen in a temperature range of 1200° C. or higher and 2200° C. or lower.

2. The manufacturing method of the phosphor according to claim 1,
    wherein the metal or inorganic compound thereof including Al is aluminum nitride powder, and
    wherein the metal or inorganic compound thereof including Eu is europium oxide powder.

3. The manufacturing method of the phosphor according to claim 1, further comprising:
    firing the raw mixture powder in the atmosphere including nitrogen in a temperature range of 1200° C. or higher and 1550° C. or lower such that nitrogen content of the raw mixture is increased; and then,
    firing the raw mixture powder at a temperature of 2200° C. or less.

4. A manufacturing method of a phosphor comprising:
    an oxygen content reduction step of reducing oxygen content and increasing nitrogen content in oxynitride phosphor powder having β-type $Si_3N_4$ crystal structure including Eu by heat-treating the powder in a reduction-nitridation atmosphere until the oxygen content in the oxynitride phosphor powder is adjusted to 0.8 mass % or less.

5. The manufacturing method of the phosphor according to claim 4, wherein the reduction-nitridation atmosphere contains ammonia gas, or mixed gas of hydrogen and nitrogen.

6. The manufacturing method of the phosphor according to claim 4, wherein the reduction-nitridation atmosphere contains hydrocarbon gas.

7. The manufacturing method of the phosphor according to claim 4, wherein the reduction-nitridation atmosphere contains mixed gas of ammonia gas and methane or propane gas.

8. A manufacturing method of a phosphor comprising: nitride or oxynitride crystal having a β-type $Si_3N_4$ structure including Al and Eu as a solid solution wherein oxygen content contained in the crystal is 0.8 wt % or less, the method comprising:

heat-treating silicon nitride raw powder in a reduction-nitridation atmosphere;

adding raw powder containing at least Eu and Al to the treated powder in which oxygen content is reduced during the heat treatment; and firing the powder at a temperature of 2200° C. or lower after the addition.

9. The manufacturing method of the phosphor according to claim 8, wherein the reduction-nitridation atmosphere contains ammonia gas, or mixed gas of hydrogen and nitrogen.

10. The manufacturing method of the phosphor according to claim 8, wherein the reduction-nitridation atmosphere contains hydrocarbon gas.

11. The manufacturing method of the phosphor according to claim 8, wherein the reduction-nitridation atmosphere contains mixed gas of ammonia gas and methane or propane gas.

* * * * *